United States Patent [19]

Hinks

[11] Patent Number: 4,978,919

[45] Date of Patent: Dec. 18, 1990

[54] MEASUREMENT AND CALIBRATION OF EDDY CURRENTS FOR MAGNETIC RESONANCE IMAGERS

[75] Inventor: Richard S. Hinks, Cleveland Hts., Ohio

[73] Assignee: Picker International, Inc., Highland Hts., Ohio

[21] Appl. No.: 344,283

[22] Filed: Apr. 27, 1989

[51] Int. Cl.[5] .......................................... G01R 33/20
[52] U.S. Cl. ................................. 324/313; 324/318
[58] Field of Search ............... 324/300, 307, 309, 310, 324/311, 312, 313, 314, 318, 319, 320, 322; 335/219

[56] References Cited

U.S. PATENT DOCUMENTS

| 4,698,591 | 10/1987 | Glover et al. | 324/318 |
| 4,818,942 | 4/1989 | Rzedzian | 324/309 |
| 4,823,084 | 4/1989 | McKinnen | 324/309 |

OTHER PUBLICATIONS

"Measurement of Magnetic Field Gradient by its Effect on the NMR Free Induction Decay" by James S. Murday, Journal of Mag. Res., 10, pp. 111-120, 1973.
"Exact Temporal Eddy Current Compensation in Magnetic Resonance Imaging Systems" by Morich et al., IEEE Transaction on Medical Imaging, vol. 7, No. 3, Sep. 1988, pp. 247-254.
"Gradient Time-Shape Measurement by NMR" by Yamamoto et al., J. Phys. E. Sci. Instrum., 19, pp. 708-711, 1986.

Primary Examiner—Michael J. Tokar
Attorney, Agent, or Firm—Fay, Sharpe, Beall, Fagan, Minnich & McKee

[57] ABSTRACT

A sample (80) is disposed in an examination region (10) through which a strong, uniform magnetic field is generated. A gradient pulse (24, 82) is created across the magnetic field. After the gradient field has been turned off, a rapid succession of radio frequency pulses (52, 84) are applied. Each radio frequency pulse is followed by a free induction decay signal (54, 86). For each free induction decay signal, the evolution of phase vs. time is determined (60) because the slope of the changing phase vs. changing time curve is proportional to resonance frequency (66) and the resonance frequency is proportional to magnetic field strength (68). For each free induction decay signal, the magnetic field strength and the time since the determination of the gradient field pulse are determined and stored (70). From the plurality of free induction decay signals, a decaying curve (28) representing eddy current induced gradient field strength vs. time is produced.

21 Claims, 3 Drawing Sheets

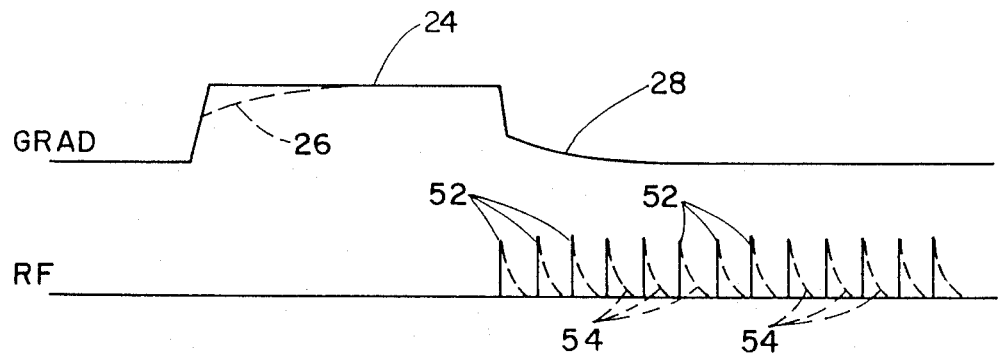
F I G. 2
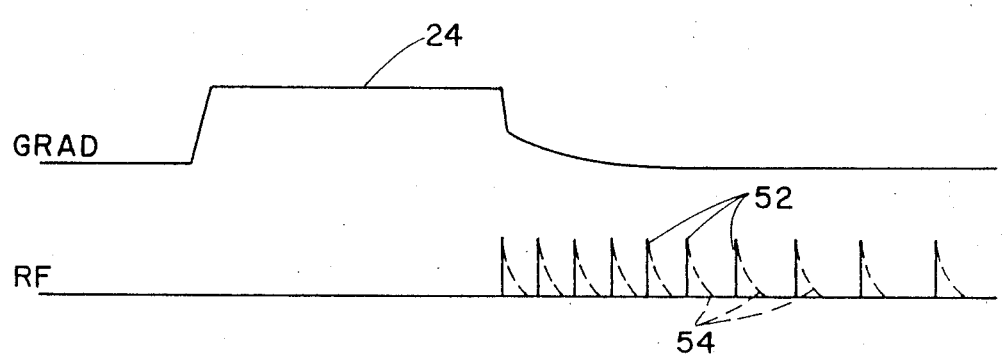
F I G. 3
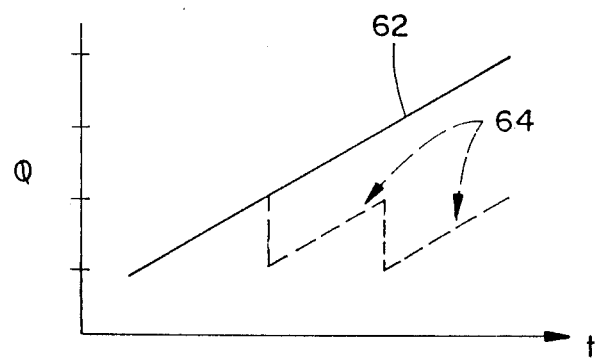
F I G. 4

MEASUREMENT AND CALIBRATION OF EDDY CURRENTS FOR MAGNETIC RESONANCE IMAGERS

BACKGROUND OF THE INVENTION

The present invention pertains to the magnetic resonance arts. It finds particular application in conjunction with compensating for eddy currents in magnetic resonance imagers and will be described with particular reference thereto. It is to be appreciated, however, that the invention may be utilized to compensate for eddy current induced fields in other applications such as diffusion or flow studies or magnetic resonance spectroscopy.

In magnetic resonance imaging, a strong substantially uniform magnetic field is generated longitudinally through an examination region. The magnetization vector of dipoles of a subject disposed in the examination region preferentially aligns with the uniform field. Radio frequency excitation pulses are supplied to cause the magnetization vectors to precess about the uniform field. Additional radio frequency pulses and magnetic field gradient pulses are applied to manipulate the precessing magnetization vector to create magnetic resonance signals, such as echo signals.

Electrical current pulses are applied to the windings of gradient field magnet coils adjacent the examination region to create the gradient field pulses. A profile, or particular temporal dependence, is selected for the current pulse in accordance with the profile of the gradient magnetic field to be applied. Commonly, the current pulses strive to approximate a square wave, trapezoid, or other ideal gradient pulse profile.

Inherently, the profile of the gradient magnetic field pulse does not match the profile of the electrical current pulse. A changing magnetic field induces eddy currents in adjacent conductive structures. The rising field at the leading edge of each gradient field pulse induces eddy currents that superimpose eddy current magnetic field components on the gradient pulse. The falling field at the trailing end of each pulse induces like, opposite polarity eddy currents that cause analogous eddy magnetic field components after the pulse. Thus, the eddy currents add unwanted eddy components to the gradient magnetic field pulse. The effect of the eddy current varies with the amount and conductivity of the material in which the eddy current is induced and the proximity of the material to the gradient coil.

In order to improve the image quality, the shape of the electrical current pulse is commonly altered such that the magnetic field produced by the sum of the current pulse and the eddy currents approximates the desired gradient magnetic field pulse profile. Commonly, a current pulse correction or pre-emphasis circuit includes a plurality of filters whose characteristic frequencies are adjustable and an amplifier with an adjustable gain associated with each filter. The filter frequency and amplification factors are adjusted to add current components whose frequencies and amplitudes effectively cancel the induced eddy current fields.

Asymmetric eddy currents are commonly dealt with by physical adjustments, such as gradient tube centering. Such physical adjustments compromise the pre-emphasis correction.

The accuracy of the eddy current compensation is affected by the accuracy with which the eddy currents or eddy fields can be measured. Various measurement techniques have been developed.

One eddy current measurement and compensation technique which is described in U.S. Pat. application Ser. No. 118,865, utilizes a search coil and an integrator. Any change in the magnetic field strength perpendicular to a plane of the coil induces a voltage in the coil which is proportional to the change in magnetic field per unit time. The voltage wave form is integrated to yield a gradient wave form which is digitized for analysis.

Although the search coil technique works well, it has some drawbacks. First, the search coil is sensitive to all magnetic field changes orthogonal to its plane, not just those changes along the magnet axes or z direction which are important in imaging. The coil is sensitive to motion, such as vibration within the main magnetic field. In order to reduce the vibration induced voltages in high field magnets, the main, uniform magnetic field may be ramped down prior to using the search coil for medium and long time constant analysis. Ramping down or turning off the main field has been found to alter reversibly the eddy current characteristics of a system. Second, the integrator circuitry tends to drift particularly during long time constant measurements. This drift or instability adversely affects the resultant measurement. Third, the search coil measures the average gradient over its area. With the relatively large search coils currently utilized, the average gradient field over the corresponding relatively large area is measured. Finer control over localization would be desirable, particularly for accurately plotting asymmetric gradient magnetic fields.

The resonant frequency of a given sample is directly proportional to the magnetic field strength. There are various NMR methods that in some way use the samples' resonant frequency to measure time-dependent changes in the magnetic field strength. The free induction decay signal (FID) from a well-defined cylinder can be used to measure a constant gradient. (J.S. Murday, "Measurement of Magnetic Field Gradient by its Effect on the NMR Free Induction Decay" J. Mag. Res., Vol. 10, pp. 111-120, 1973). The Murday method has been extended to measure short time constant eddy currents by observing the phase response of a free induction decay signal from a small, uniform sample (E. Yamamoto and H. Khono, "Gradient Time-Shape Measurement by NMR" *J. Phys. E: Sci. Instrum.*, Vol. 16, pp. 108-111, 1986). However, spin-spin relaxation renders the Yamamoto and Khono method not applicable to medium and long time constant measurements. U.S. Pat. No. 4,698,591 to G.H. Glover and N.J. Pelc extend this methodology to measure medium and long time constant eddy current effects. One FID signal is acquired from each scan sequence and its phase evolution is calculated. The absolute phase behavior of an entire series of FIDs acquired at successive delays after the gradient is forced to be continuous in order to construct a gradient response curve. Like Yamamoto and Khono, the Glover and Pelc technique is also limited by spin-spin relaxation such that a continuous series of overlapping FIDs must be acquired to map medium or long term effects. A further weakness of the Glover and Pelc technique is that any absolute phase errors accumulate in each successive FID.

The present invention contemplates a new and improved technique for the accurate measurement of eddy currents which overcomes the above referenced deficiencies and others.

SUMMARY OF THE INVENTION

In accordance with one aspect of the present invention, a method of eddy current measurement is provided. A small sample is disposed in a strong magnetic field in an examination region. A preselected gradient is applied across the magnetic field and removed. Immediately following removal of the gradient, magnetic resonance is induced in the sample and the frequency of the reduced response is measured repeatedly in rapid succession.

More specifically to the preferred embodiment, the phase evolution or change per unit time is measured for each induced response with phase unwrapping. The change in phase per unit time is proportional to frequency of the resonance which is proportional to the field strength at the corresponding resonance excitation.

One advantage of the present invention is that it measures only z magnetization. It is relatively insensitive to vibration.

Another advantage of the present invention is that it is particularly adept at measuring long time constants. Each point of a derived curve of the frequency vs. time is derived independently from an FID measurement relative to an RF synthesizer that has inherently greater stability than an integrator.

Another advantage of the present invention is that it achieves good localization. Small spatial variations in magnetic field can be accurately measured.

Still further advantages of the present invention will become apparent to those of ordinary skill in the art upon reading and understanding the following detailed description of the preferred embodiment.

BRIEF DESCRIPTION OF THE DRAWINGS

The invention may take form in various steps and arrangements of steps and in various components and arrangements of components. The drawings are only for purposes of illustrating a preferred embodiment and are not to be construed as limiting the invention.

FIG. 2 illustrates a gradient pulse and free induction decay collection sequence including a typical eddy current induced gradient field response and correction;

FIG. 3 illustrates an alternate embodiment to the sequence of FIG. 2 in which the RF pulse spaces are nonconstant;

FIG. 4 illustrates a resonance frequency determining scheme;

DETAILED DESCRIPTION OF THE PREFERRED EMBODIMENT

Figure 1:
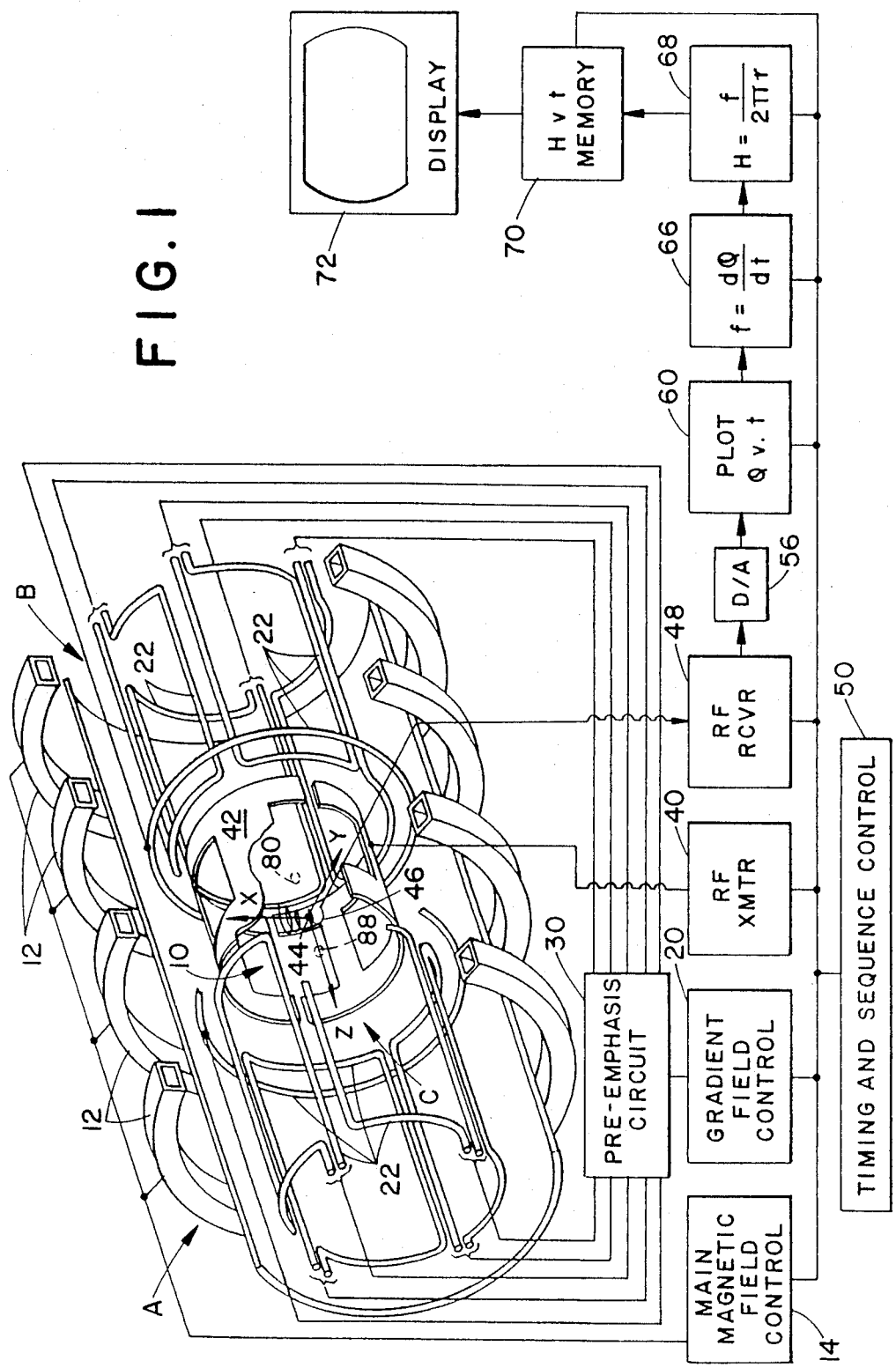
FIG. 1 is a diagrammatic illustration of a magnetic resonance imaging apparatus in accordance with the present invention.

With reference to FIG. 1, a magnetic resonance imaging apparatus includes a main magnetic field means A for generating a substantially uniform, strong, magnetic field longitudinally through an examination or image region 10. The main magnetic field means includes a plurality of superconducting, permanent, or resistive main field magnets 12 which are operated under the control of a magnetic field control means and power supply 14. Various electrical and mechanical shimming techniques are provided, as are conventional in the art, for rendering the resultant main magnetic field linear and uniform through the image region after correction for distortion caused by surrounding imager hardware.

A gradient field means B selectively creates gradient magnetic fields across the main magnetic field in the examination region 10. More specific to the preferred embodiment, linear gradients along an x, y, and z axis are selectively applied. The gradient field means includes a gradient field control means 20 which selectively provides current pulses to gradient coils 22. The gradient field control means creates current pulses to cause a resultant gradient magnetic field pulse 24 with a preselected profile. However, due to eddy current magnetic fields, the profile of the current pulse and the gradient magnetic field pulse normally do not match. Rather, eddy currents tend to retard or round off a leading corner 26 of a gradient field pulse and cause a complimentary lingering or residual magnetic field tail 28 after the end of the gradient field pulse.

A pre-emphasis circuit 30 adds a current boost to the beginning portion of the current pulse to compensate for eddy currents. Typically, the current pre-emphasis means includes an adjustable frequency selecting means and an adjustable amplitude selecting means. Commonly, these are embodied in a series connected frequency filter or resonant circuit and amplifier. A plurality of these series connected filter and amplifier combinations are connected in parallel. The frequency selecting means is adjusted such that the pre-emphasis circuit adds a current component with the same frequency as one of the eddy current components. The amplitude adjusting means is adjusted to match the added current component amplitude to the eddy current component amplitude.

A resonance excitation means C includes a radio frequency transmitter 40 for generating magnetic resonance excitation pulses and other magnetic resonance manipulation pulses. A radio frequency antenna 42 is disposed adjacent the examination region for transmitting radio frequency pulses into a calibration sample 44 disposed at the geometric center of the examination region. A receiver coil or antenna 46 receives radio frequency resonance signals, particularly free induction decay signals emanating from the sample. A radio frequency receiver 48 demodulates the resonance signals.

In the preferred embodiment, the calibration sample is a water and copper sulfate solution at 50 grams per liter. This sample composition is selected for its very short relaxation times which allows the FID to be measured at very short intervals or repeat times.

A timing and control means 50 controls the gradient field means 20, the radio frequency transmitter 40, and other circuit components to implement selected gradient and radio frequency pulse sequences, such as the sequence of FIG. 2. That is, the gradient field control means 20 and the pre-emphasis circuit 24 generate current pulses to create the magnetic field gradient 24, e.g. a z-gradient, across the examination region. Immediately following the end of the gradient 24, the radio frequency transmitter 40 and radio frequency antenna 42 transmit a series of radio frequency magnetic resonance excitation pulses 52 in rapid succession. Typically, the radio frequency pulses are at 10 milliseconds intervals or longer and the series extends over 3.5 seconds or longer. However, greater time resolution is achieved by repetition of the gradient-[FID . . .] sequence with modified timing parameters, i.e. different delay times from the gradient ramp. Immediately following each radio frequency pulse, a resultant free induction decay signal 54 emanates from the sample, is received by the receiving means 48, and digitized by an analog-to-digital converter 56. Optionally, as shown in FIG. 3, the intervals between radio frequency pulses 52 can be increased toward the end of the eddy current gradient field tail in accordance with the exponential decay characteristics.

With reference to FIG. 4, a plotting means 60 plots signal phase of the FID vs. time with phase unwrapping. That is, each time the phase crosses $2\pi$, $2\pi$ is added to the phase such that the phase continues to grow 62 in the resultant plot rather than cycling between zero and $2\pi$ 64. The slope of this plot, i.e. $d\phi/dt$ represents the resonant frequency. More precisely, this slope represents the median resonant frequency during the FID sampling interval. The resonant frequency fr is proportional to the magnetic field H, $f_r = 2\pi\gamma H$ where $\gamma$ is the gyromagnetic ratio of the sample. A slope or frequency determining means 66 measures the slope of the $d\phi/dt$ plot, hence, the resonance frequency. A magnetic field strength determining means 68 converts the frequency to an indication of the magnetic field strength using this relationship.

A magnetic field strength vs. time memory 70 stores each determined magnetic field strength along with the time since the end of the gradient field pulse. A display means 72, such as a CRT or a video monitor, displays the magnetic field strength vs. time curve. The eddy magnetic field 28 is roughly a decaying exponential curve. The resultant measured response is the sum of the exponential fields of each of the plurality of eddy currents. If the gradient is on for a time substantially longer than the longest time constant, the decaying exponential responses 28 to the pulse falling edge is substantially the inverse of the leading edge response 26 at the beginning of the gradient field pulse. To square the leading edge, one adds current components which compensate for the displayed eddy current magnetic field. This can be done by computing the current components that duplicate the inverse of the normalized eddy current field as it decays from zero to one.

Preferably, an operator manually views the decay curve and determines a frequency or time constant and amplitude which offsets or cancels the trailing end of the curve. This is subtracted from the curve leaving a shorter exponentially decaying curve. The operator determines the time constant or frequency and amplitude for the next current component to remove the trailing edge of the remaining curve. This process is repeated until the curve is substantially removed or removed to within acceptable tolerances. The pre-emphasis circuit is adjusted in accordance with the selected frequencies and amplitudes. Alternately, because the data stored in the magnetic field strength vs. time memory 70 has already been digitized, appropriate computer implemented analysis and generation of the appropriate eddy current time constant and amplitudes may be undertaken. An appropriate computer based analysis means may be provided to perform this analysis and automatically adjust the pre-emphasis current means accordingly. The computer may use an iterative approach analogous to the above described manual approach or may calculate a multi-exponential fit to the data and determine all pre-emphasis time constant and amplitude settings in one operation.

Figure 5:
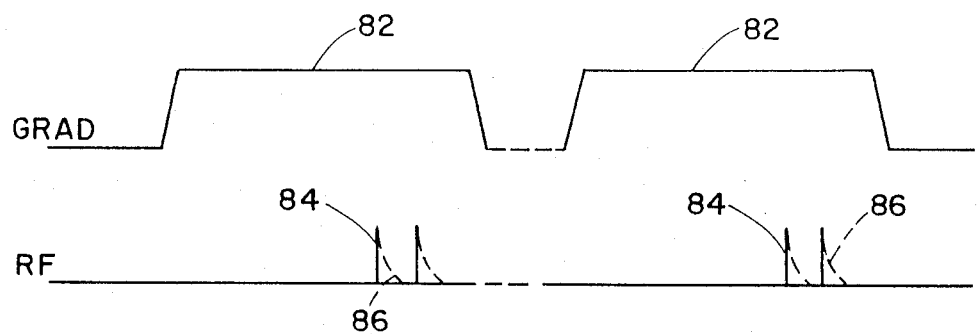
FIG. 5 illustrates a technique for measuring spatial linearity of gradient magnetic fields in accordance with the present invention.

With reference to FIG. 5, the present invention may also be utilized to monitor the spatial linearity, strength, and other characteristics of each generated gradient magnetic field. To this end, the sample is placed off center along one of the axes, e.g. at position 80 along the z axis. A gradient magnetic field 82 is applied and one or more radio frequency pulses 84 are applied to excite magnetic resonance at preselected times into the gradient magnetic field. The time into the gradient magnetic field is selected to be sufficiently long that eddy current effects have dissipated. The free-induction decay signal 86 following each radio frequency pulse is received and the resonant frequency determined. For a given physical location, the field should be constant during the pulse. Accordingly, the FID signals may be averaged. The sample 44 is then shifted to another point along the z axis, such as point 88 which is symmetric relative to the geometric center of the system to point 80. The sequence is repeated, the resultant free induction decay measured, and resultant gradient field strength determined. If the gradient magnetic field is linear, then the magnetic field strength at these two points describes the gradient magnetic field along the z axis. Optionally, additional points may be taken along the z axis, as may be appropriate, to measure any non-linearities in the magnetic field strength. Analogous measurements may be made along the x and y or other axes.

Figure 6:
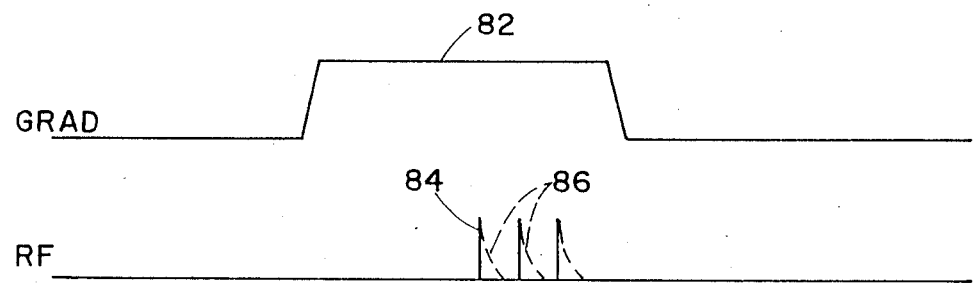
FIG. 6 illustrates an alternate embodiment for measuring temporal linearity; and, FIG. 7 illustrates an alternate embodiment for measuring response linearity.

With reference to FIG. 6, the same technique may also be utilized to measure temporal stability of the gradient field 82. To this end, the series of radio frequency pulses 84 is applied after eddy currents die out and the FID signals 86 measured. All FIDs should be the same until the gradient current is altered. Rather than averaging, the frequency of each is recorded and analyzed for variation from other FID signals acquired under the same conditions.

Figure 7:
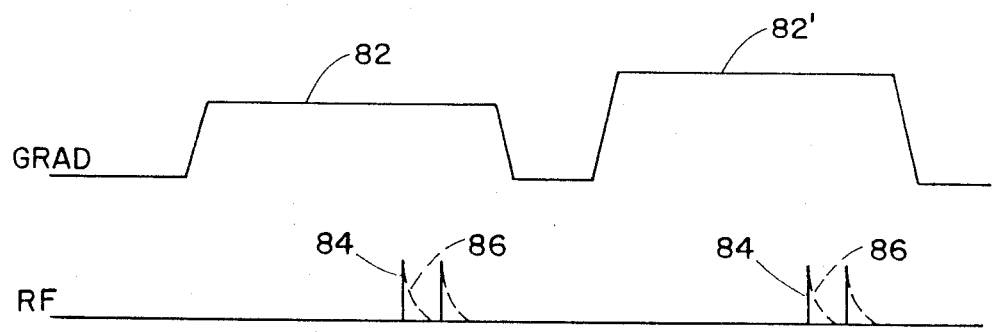

With reference to FIG. 7, another use is to measure the linearity of the gradient response to an input signal. For a linear response, gradient strength, in the absence of eddy currents, should be directly proportional to the input signal to the gradient amplifiers. The response is monitored by repeating the sequence of FIG. 5 at some location but with different input levels or ramp height 82, 82'.

The invention has been described with reference to the preferred embodiment. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiment, the invention is now claimed to be:

1. A method of measuring eddy currents induced in a magnetic resonance apparatus, the method comprising:
   disposing a sample in a main magnetic field in an examination region of the magnetic resonance apparatus;
   applying a preselected magnetic field gradient across the magnetic field in the examination region;
   ending application of the preselected magnetic field gradient, ending application of the preselected magnetic field gradient causing eddying currents in adjacent portions of the magnetic resonance apparatus, which eddy currents generate an eddy current magnetic field gradient which decay with time as the eddy currents decay;

following the ending of the application of the preselected magnetic field gradients and during the eddy current magnetic field gradients, evoking a series of free induction decay signals from the sample at a series of times;

measuring signal phase of each free induction decay signal vs. time;

determining a slope of the measured phase vs. time, which slope is indicative of main and eddy current magnetic field strength, whereby the magnetic field strength is determined at each of the series of times following the ending of the application of the preselected magnetic field gradient.

2. A method of measuring eddy currents in a magnetic resonance apparatus, the method comprising:

disposing a sample in a main magnetic field in an examination region of the magnetic resonance apparatus;

applying and ending application of a magnetic field gradient across the magnetic field in the examination region, which applying and ending of the magnetic field gradient induces decaying eddy currents in adjacent portions of the magnetic resonance apparatus, which eddy currents generate corresponding eddy magnetic field gradients in the examination region;

during the eddy current magnetic field gradient, rapidly applying a series of radio frequency magnetic resonance excitation pulses, each of which induces magnetic resonance in the sample, and each of which is followed by a free induction decay signal;

monitoring each free induction decay signal and determining its frequency, which frequency is indicative of magnetic field strength, whereby the magnetic field strength at a series of times during the decaying eddy current magnetic field gradient is determined.

3. The method as set forth in claim 2 wherein the step of applying radio frequency magnetic resonance excitation pulses is repeated at non-constant intervals.

4. A method of magnetic resonance eddy current measurement comprising:

(a) disposing a sample in a main magnetic field in an examination region;

(b) causing a preselected magnetic field gradient across the magnetic field in the examination region;

(c) terminating causation of the magnetic field gradient causing a decaying eddy magnetic field;

(d) at a first duration following termination of causation of the preselected magnetic field gradient and during the eddy magnetic field, inducing a first series of free induction decay signals from the sample;

(d) monitoring each of the first series of free induction decay signals and determining its frequency, which frequency is indicative of eddy magnetic field strength, which eddy magnetic field strength is proportional to eddy current strength;

(f) again causing and terminating causation of the preselected magnetic field gradient;

(g) at a second duration following terminating causation of the preselected magnetic field gradient, inducing and monitoring a second series of free induction decay signals.

5. A method of magnetic resonance eddy current measurement in a magnetic resonance apparatus, the method comprising:

disposing a substance that has a short relaxation time in a main magnetic field in an examination region;

applying and terminating application of a preselected magnetic field gradient across the magnetic field in the examination region, changes in magnetic field strength during applying and terminating application of the preselected gradient inducing eddy currents in adjacent portions of the magnetic resonance apparatus, the eddy currents decay with time generating eddy magnetic fields;

during one of the eddy magnetic fields inducing magnetic resonance signals from the sample;

monitoring the magnetic resonance signals and determining a property of the magnetic resonance signals which are indicative of eddy current strength.

6. The method as set forth in claim 5 wherein the substance included a copper sulfate and water solution.

7. A method of measuring magnetic field gradients in a magnetic resonance apparatus, the method comprising:

disposing a sample at a first location in an examination region through which a magnetic field is created;

in the presence of a magnetic field gradient, exciting selected dipoles within the sample to resonance and monitoring a magnetic resonance signal generated by the dipoles;

determining a first resonant frequency of the monitored magnetic resonance signals which first resonant frequency is indicative of the magnetic field strength as the first location;

disposing the sample at a second location within the examination region;

in the presence of the magnetic field gradient, again exciting the selected dipoles of the sample to resonance and monitoring the magnetic resonance signals generated by the excited dipoles;

determining a second resonant frequency of the monitored magnetic resonance signals, which second resonant frequency is indicative of magnetic field strength at the second location;

form a difference in the first and second resonant frequencies, determining a difference in magnetic field strength between the first and second location.

8. The method as set forth in claim 7 wherein the steps of determining resonant frequency include:

measuring a phase of the induced magnetic resonance signal as a function of time and determining the slope of a rate of phase change vs. time change, which slope is proportional to frequency.

9. A method of measuring magnetic field gradients in a magnetic resonance apparatus, the method comprising:

(a) disposing a sample at a first point in an examination region through which a magnetic field is created;

(b) creating a magnetic field gradient across the magnetic field;

(c) in the presence of the magnetic field gradient, inducing free induction decay signals from the sample;

(d) monitoring the free induction decay signals;

(e) determining a resonance frequency of each monitored free induction signal; and, (f) comparing the resonance frequencies to determine variations in magnetic field strength.

10. The method as set forth in claim 9 further including:
placing the sample at a second point in the examination region;
repeating steps (b) through (e); and,
wherein the comparing steps includes comparing the resonance frequencies determined with the sample at the first and second points.

11. The method as set forth in claim 9 further including:
creating another gradient of a different amplitude across the magnetic field;
repeating steps (c), (d), and (e); and,
wherein the comparing step includes comparing the resonance frequencies with the different gradient amplitudes.

12. The method as set forth in claim 9 wherein the monitoring step includes measuring signal phase of the free induction decay signal vs. time and wherein the frequency determining step includes determining a slope of the measured phase vs. time.

13. The method as set forth in claim 9 wherein the step of inducing free induction decay signals includes rapidly applying a series of radio frequency magnetic resonance excitation pulses, each of which induces magnetic resonance in the sample, and is followed by one of the free induction decay samples.

14. A method of measuring magnetic field gradients comprising:
(a) disposing a sample at a selected location in an examination region;
(b) creating a magnetic field through the sample;
(c) causing a first magnetic field gradient across the magnetic field through the sample;
(d) during the first magnetic field gradient, exciting dipoles in the sample to resonate and generate a magnetic resonance signal;
(e) monitoring the resonance signal;
(f) determining a first magnetic field strength at the selected location from a resonance frequency of the monitored resonance signal;
(g) creating a second magnetic field gradient across the magnetic field through the sample;
(h) repeating steps (d), (e), and (f) to determine a second magnetic field strength; and,
(i) comparing the first and second magnetic field strengths.

15. A method of measuring magnetic field strengths in a magnetic resonance apparatus, the method comprising:
disposing the sample in an examination region;
generating a generally uniform, strong magnetic field through the image region;
causing a magnetic field gradient across the magnetic field;
following termination of the magnetic field gradient, cyclically inducing magnetic resonance in the sample and measuring a frequency of the induced magnetic resonance;
storing each measured frequency and a corresponding time since termination of the magnetic field gradient, whereby an indication of change in magnetic field strength with time since the gradient termination is stored.

16. The method as set forth in claim 15 wherein the inducing step includes inducing a succession of free induction decay signals and the measuring step includes measuring the frequency of the free induction decay.

17. The method as set forth in claim 16 wherein the inducing step further includes applying a series of radio frequency pulses, each of which induced one of the free induction decay signals.

18. A method of determining variation in a magnetic field strength, the method comprising:
inducing at least a first free induction decay signal and a second free induction decay signal from a sample in the magnetic field;
determining first and second resonance frequencies of the first and second free induction decay signals, respectively;
determining first and second magnetic field strengths from the first and second resonance frequencies;
comparing the first and second magnetic field strengths to determine the magnetic field strength variation.

19. An apparatus for measuring gradient magnetic fields, the apparatus comprising:
a main magnetic field means for generating a generally uniform magnetic field through an examination region;
a gradient field means for selectively causing a gradient field pulse of a selected duration across the main magnetic field in the examination region;
a radio frequency transmitter means for applying a series of radio frequency pulses into the examination region to induce resonance in selected dipoles of a sample disposed in the examination region, the selected dipoles generating a magnetic resonance signal after each radio frequency pulse of the series;
a radio frequency receiver for receiving the series of magnetic resonance signals;
a frequency determining means for determining a frequency of each received resonance signal, which frequency is indicative of a magnetic field strength during the resonance signal; and
a memory means for storing an indication of each determined magnetic field strength and a time between the gradient field pulse and each magnetic field strength determination.

20. The apparatus as set forth in claim 19 wherein each magnetic resonance signal includes a free induction decay signal and wherein the frequency determining means includes a plotting means for determining an evolution of phase vs. time during each free induction decay and a slope determining means for determining a slope or relative rate of change of phase vs. time, which slope is proportional to the resonance frequency.

21. A method of measuring gradient currents in a magnetic resonance apparatus, the method comprising:
disposing a sample in a substantially uniform main magnetic field in an examination region of the magnetic resonance apparatus, the sample having a first magnetic resonance frequency in the main magnetic field along;
applying a magnetic field gradient pulse across the examination region, changes in magnetic field strength at an end of the magnetic field gradient pulse inducing eddy currents in adjacent portions of the magnetic resonance apparatus, which eddy currents decay with time and generate an eddy magnetic field;
during the eddy magnetic field, inducing a series of free induction decay signals from the sample;
monitoring each free induction decay signal and determining its frequency;
comparing the first resonance frequency with each of the monitored free induction decay signal frequencies to provide an indication of eddy current strength.

* * * * *